(12) United States Patent
Charpin-Nicolle et al.

(10) Patent No.: US 7,745,070 B2
(45) Date of Patent: Jun. 29, 2010

(54) STRUCTURE OF A LITHOGRAPHY MASK

(75) Inventors: Christelle Charpin-Nicolle, Paris (FR); Jean-Yves Robic, Grenoble (FR)

(73) Assignee: Commissariat A l'Energie Atomique, Paris (FR)

(*) Notice: Subject to any disclaimer, the term of this patent is extended or adjusted under 35 U.S.C. 154(b) by 287 days.

(21) Appl. No.: 11/665,312

(22) PCT Filed: Oct. 19, 2005

(86) PCT No.: PCT/FR2005/050868
§ 371 (c)(1), (2), (4) Date: Apr. 12, 2007

(87) PCT Pub. No.: WO2006/043004
PCT Pub. Date: Apr. 27, 2006

(65) Prior Publication Data
US 2007/0292772 A1 Dec. 20, 2007

(30) Foreign Application Priority Data
Oct. 19, 2004 (FR) .................................. 04 11073

(51) Int. Cl.
*G03F 1/00* (2006.01)
(52) U.S. Cl. .......................................................... 430/5
(58) Field of Classification Search .................... 430/5, 430/322, 323, 394; 378/35
See application file for complete search history.

(56) References Cited

U.S. PATENT DOCUMENTS

| 4,110,815 | A | 8/1978 | Frade et al. | 361/433 |
| 6,298,113 | B1 * | 10/2001 | Duclos et al. | 378/19 |
| 6,998,204 | B2 * | 2/2006 | Furukawa et al. | 430/5 |
| 7,282,307 | B2 * | 10/2007 | Hector et al. | 430/5 |
| 7,390,596 | B2 * | 6/2008 | Ishibashi et al. | 430/5 |
| 2003/0228530 | A1 | 12/2003 | Yan et al. | 430/5 |
| 2004/0125649 | A1 | 7/2004 | Durlam et al. | 365/158 |

FOREIGN PATENT DOCUMENTS

WO    WO 03/085709 A1    10/2003

OTHER PUBLICATIONS

Seach Report, FR 0411073 FA 656654, 3 pgs, (Mar. 10, 2005).

* cited by examiner

*Primary Examiner*—Stephen Rosasco
(74) *Attorney, Agent, or Firm*—Nixon Peabody LLP

(57) ABSTRACT

The invention relates to a reflection lithography mask comprising, on a substrate (S), a reflector coating (RC) and a stack comprised of an etching barrier layer and an absorbing layer, said stack covering only a part of the reflector coating. The absorbing layer is made solely of dielectric material and constitutes the surface layer of the mask. Advantageously, this dielectric material is $HfO_2$. Said material makes it possible to reduce the thickness of the mask pattern and as a result to decrease the shadow region (Z) during mask exposure. The invention applies to reflection lithography.

13 Claims, 2 Drawing Sheets

STRUCTURE OF A LITHOGRAPHY MASK

CROSS REFERENCE TO RELATED APPLICATIONS OR PRIORITY CLAIM

This application is a national phase of International Application No. PCT/FR2005/050868 entitled "Lithography Mask Structure", which was filed on Oct. 19, 2005, which was not published in English, and which claims priority of the French Patent Application No. 04 11073 filed Oct. 19, 2004.

TECHNICAL FIELD

The invention relates to a structure for a mask for reflection lithography, in particular for extreme ultraviolet (EUV) lithography. The invention also relates to a process for manufacturing said mask.

Such a mask can be used notably for reflection lithography, in particular for extreme UV lithography. The invention more specifically relates to the absorber stack used in EUV masks.

PRIOR ART

Lithography, or photolithography, is the method by which an image from a mask is transferred to a layer of photosensitive resin deposited on a sample. This step of the exposure of a resin through a mask, using a light source and an optical system, is carried out using a device called a photorepeater. After exposure, the resin is developed, thus making it possible to obtain on the sample a resin mask which will be used in the steps necessary for producing microelectronic devices (etching mask, deposition mask or ion implantation mask).

Progress in optical lithography has been a key factor in the growth of the integrated circuit (IC) industry over the years. The main factor leading to improvements has been the use of shorter and shorter wavelengths for exposing resins. Thus, the wavelengths used in lithography have passed from 365 nanometers to 248 nanometers to 193 nanometers today.

The reduction in wavelength has made it possible to reduce the critical dimensions of integrated circuits to approximately one-tenth of a micron. This technical progress, along with the availability, over time, of photolithography production equipment, masks and resins, has allowed the microelectronics industry to continue its growth over the past 30 years.

However, pursuit of the miniaturization of integrated circuits with patterns smaller than 0.1 micron requires a new technological approach that breaks away from optical lithography. Indeed, the refractive materials commonly used for optical lithography become too absorbent at wavelengths shorter than 190 nanometers.

Various solutions grouped under the name NGL (next-generation lithography) have been proposed. The stakes are high for the semiconductor industry. Among next-generation lithographies, extreme ultraviolet (EUV) lithography, using wavelengths between 10 nm and 14 nm (soft X-rays), is one of the most promising avenues. At these short wavelengths, resolution below 0.1 micron can be obtained while maintaining a low numerical aperture and a depth of field greater than one micron. This technology may satisfy several sub-0.1-micron technological generations until the arrival of the 256-Gbit generation expected by the Semiconductor Industry Association (SIA) to be in production in 2012.

EUV lithography is one of the chosen solutions. Significant work on this subject is under way in the United States, Japan and Europe. The technological challenges posed by the implementation of extreme UV lithography concern five aspects in particular: the source of EUV radiation, the projection optics of the photo masking device, the masks, the methods using resins and the metrology associated with the development of optics and masks.

In contrast with current optical lithography masks (transmission masks produced by the deposition of chrome on a quartz substrate), an EUV lithography mask is a reflection mask and not a transmission mask.

FIG. 1 is a cross-section of an EUV mask according to the prior art. Said mask is composed of a substrate 1 on which is deposited a reflector coating 2 which is, in turn, coated with an absorbing layer 4. The pattern to be projected on the resin to be exposed is formed on the mask by the etching of the absorbing layer 4. Thus, only the etched areas will be reflective and come to be written during lithographic projection. As is illustrated in FIG. 1, a layer 3, between the absorbing layer 4 and the reflector coating 2, may be provided for serving as a barrier layer for the etching of the absorbing layer if the etch selectivity between the absorbing layer and the reflector coating is not sufficient. Said layer 3 also participates in absorption.

The substrate 1 can be a silicon wafer with a diameter of 200 mm. Other substrates can be envisaged in order to take into account problems of stability under luminous flux, such as low-expansion-coefficient glass, for example.

The reflector 2 is comprised of a stack of multilayers. A high reflection coefficient is obtained by means of a multilayer interference structure and by the proper choice of the materials constituting the multilayers. Molybdenum and silicon perform well at a wavelength of 13 nanometers and reflection coefficients greater than 65% can be obtained with approximately forty multilayers. Each multilayer is formed from a layer of molybdenum and a layer of silicon. Other layers of materials are possible, such as Mo/Be or Ru/Be, for example.

The absorbing layer 4 must absorb in the EUV spectral range, in particular around 13 nanometers. The materials that may be used to constitute said layer are many. The materials used in microelectronics (such as Ti, Ta, TaSi, TiW, W, Cr, TiN and Al) are preferred.

For optics having a reduction factor of 4, the dimension of the pattern etched into the absorbing layer will be four times larger than the pattern exposed on the circuit; this is referred to as a 4× reticle. To maintain the specifications related to the exposure step, i.e., to print on the exposed resin a pattern of good geometric definition, preserving the desired dimensions over the entire exposed area, and without defects, the production of the mask must meet certain conditions:

- The mask must have a flatness characterized by distortion values of less than 0.4 micron for a diameter of 200 mm.
- The reflection coefficient of the mask must be sufficient to guarantee the EUV radiation dose required for exposure, i.e., a reflection coefficient greater than 60%.
- The absorbing layer must be produced (deposition and etching) in accordance with the desired geometry.
- The mask's surface defect level must be extremely low, on the order of a few $10^{-3}$ defects/cm$^2$ for defects greater than or equal to approximately 50 nanometers in size.
- The multilayer and the absorbing layer constituting the mask are located in the object plane of the optical system. Consequently, any significant variation of phase or amplitude of the field reflected by the mask may potentially be replicated by the lithography process and thus may impart a crippling defect into the resin. Although methods exist for repairing defects in the absorbing layer, there is no satisfactory solution for repairing defects in the reflective multilayer. The latter condition remains the major problem in mastering the production of masks. The best results obtained are on the order of a few $10^{-2}$ defects/cm$^2$.

Mask specifications, in terms of quality control and defects, necessitate the technological mastery of all of the steps involved in mask production. Masks are produced in two general steps:

production of the multilayer reflector substrate (blank mask), production of the reticle (mask patterning), i.e., production of the absorbent patterns on the multilayer reflector.

Numerous materials have been proposed for the production of the absorber stack. The absorbent materials found in the literature are usually metallic materials, such as Ti, Ta, TaSi, TiW, W, Cr, TiN and Ru. Nonmetal materials, such as Ge, can also be found.

It is necessary to include the buffer layer 3 (FIGS. 1 and 2) for the following reasons:

to control the stopping of the etching process (so as to not damage the mirror), to perform an inspection using deep-UV (DUV) light (257 nanometers, for example) to detect, and possibly to correct, defects.

In addition, it is important not to damage the reflector coating, and for this reason it is recommended not to:

deteriorate the upper layers during the technological steps, exceed 150° C. during the technological steps, otherwise the mask may suffer a loss of reflectivity (desired reflectivity greater than 67%).

With regard to the absorbing element 4, said element must make it possible for the absorber stack (layers 3 and 4) to obtain good absorptivity in extreme UV, i.e., average reflectivity of the absorber stack less than 0.5%.

The absorber stack must have low DUV reflectivity (at a wavelength between 120 nanometers and 257 nanometers), i.e., reflectivity less than 20% (class D) or even less than 5% (class A).

With regard to surface qualities, the mirror's defect level must be extremely low, i.e., on the order of a few $10^{-3}$ defects/cm$^2$ for defects greater than or equal to approximately 50 nanometers in size.

The roughness of the absorber stack's walls must be very low.

In addition, as indicated in FIG. 2, the absorbing element produces a shadow region 6 of dimension 7 on the surface of the reflector coating during the exposure of the mask by radiation 5. To minimize the shadow effects related to the angle of incidence of the extreme UV beam on the mask (even for a low angle of incidence, generally 5° to 6° and occasionally a little less), it may be advantageous to decrease the thickness of the absorber stack given that this shadow effect becomes greater and more disadvantageous as the patterns to be exposed become smaller.

DISCLOSURE OF THE INVENTION

The object of the invention is to reduce the aforesaid shadow effects arising from the absorbing layer.

It is also an object of the invention to provide an alternative to the metallic material traditionally used as an absorber.

Specifically, the invention relates to a reflection lithography mask comprising, on a substrate, a reflector coating and a stack comprised of an etching barrier layer and an absorbing layer, said stack covering only a part of the reflector coating, characterized in that the absorbing layer is made solely of dielectric material and constitutes the surface layer of the mask.

Admittedly, an EUV mask comprised of an improved absorber has already been disclosed in the document (1) US 2003/0228530 A. However, said document does not disclose the use of an absorbing layer made solely of dielectric material: it discloses the use of an absorber comprised of a metal and a dielectric.

Additionally, the document (2) WO 03/085709 A (see also EP 1498936 A) discloses an EUV mask comprised of an absorbing layer and, thereon, a layer of low reflectivity which allows good contrast to be obtained during inspection of the etching of the absorbing layer; thus, the absorbing layer mentioned in the document does not constitute the surface layer of the mask.

On this subject, it is specified that in the present invention obtaining good contrast during inspection of the etching of the absorbing layer is ensured by a wise choice of the stack. Document (2) clearly indicates that inspection should be disassociated from EUV absorption.

The aforementioned dielectric material is absorbent preferably in the extreme ultraviolet (EUV) radiation wavelength range.

According to a preferred embodiment of the invention, the dielectric material contains hafnium (Hf).

This dielectric material can be in the form of hafnium oxide ($HfO_2$).

Preferably, the respective thicknesses of the absorbing layer and the etching barrier layer are selected in such a way that the stack of these layers forms an interference system exhibiting good absorption in the EUV range and good reflectivity contrast in the DUV-visible range during a step of inspection of the etching of the absorbing layer.

Preferably, the materials of the absorbing layer and the etching barrier layer are selected in such a way that they have good etch selectivity and that the etching barrier layer has good etch selectivity with respect to the reflector coating.

The etching barrier layer can be made of a dielectric material.

The dielectric material of the absorbing layer being made of hafnium oxide ($HfO_2$), the etching barrier layer can be made of aluminum oxide ($Al_2O_3$).

Preferably, the thicknesses of $HfO_2$ and $Al_2O_3$ are equal to 40 nm and 20 nm, respectively.

The invention also relates to a method for manufacturing a mask as described previously. Said method comprises the following steps:

Step 1: Deposition, on a substrate, of alternating reflecting layers of different optical indices, forming an interference system.

Step 2: Deposition of an etching barrier layer on the aforementioned alternating layers.

Step 3: Deposition of a layer of the aforementioned dielectric material for the purpose of producing the absorbing layer.

Step 4: Spreading of a lithography resin.

Step 5: Production, in the resin, of a pattern having the shape of the absorbing layer to be obtained.

Step 6: Etching, preferably chemical etching, of the layer of dielectric material.

Step 7: Stripping of the resin, preferably comprised of dry stripping of the resin followed by wet stripping.

Step 8: Etching of the etching barrier layer.

The dielectric material is advantageously made of $HfO_2$ and step 3 may be carried out by ion beam sputtering (IBS) at a temperature of approximately 50° C.

Preferably, the method comprises in addition a step of inspection of the etching of the absorbing layer before the elimination of the etching barrier layer.

Inspection is preferably carried out by means of radiation having a wavelength in the visible to deep ultraviolet (DUV) range.

Moreover, complementary etching of the absorbing layer, of a localized character, for example, may be carried out to enable good etching of the absorbing layer without damaging the reflective multilayer comprised of the alternating reflecting layers, said reflective multilayer being protected by the etching barrier layer.

BRIEF DESCRIPTION OF THE DRAWINGS

The various objects and characteristics of the invention will appear more clearly in the description which follows as well as in the attached figures in which.

DETAILED DESCRIPTION OF SPECIFIC EMBODIMENTS OF THE INVENTION

Figure 3A:
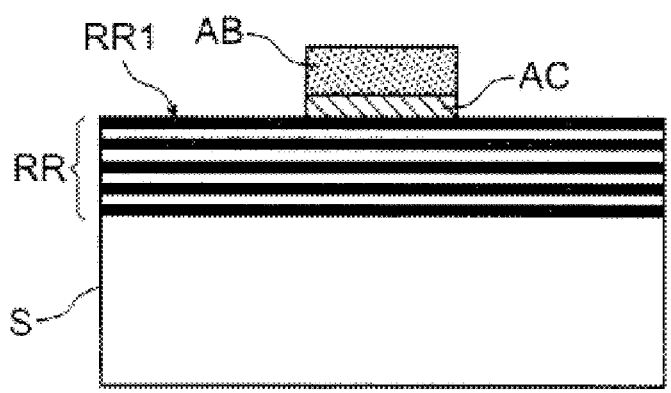
FIGS. 3a and 3b represent embodiments of masks according to the invention.

In referring to FIG. 3a, one embodiment of a mask according to the invention will be described. This mask comprises, on a substrate S, a reflector coating RC which is typically a stack of layers of materials of different optical indices such that this stack of layers behaves like a Bragg mirror for incident radiation having a wavelength used in lithography. This stack of layers can be alternating layers of molybdenum and silicon.

A layer AB made of absorbing material is located on the surface RC1 of the reflector coating. Included between the layer AB and the surface RC1 is an etching barrier layer EB whose role is to protect the surface RC1 during the etching of the layer AB in order to define its contour. It should be noted that the layer AB constitutes the surface layer of the mask: the layer EB is between the layer AB and the coating RC.

According to the invention, the layer AB is made entirely of dielectric material, notably a dielectric with average or high permittivity.

The dielectric material is absorbent in the extreme UV radiation wavelength range and can be used in said range.

Advantageously, the absorbing material can be a dielectric material comprised of hafnium, for example hafnium oxide ($HfO_2$).

Figure 1:
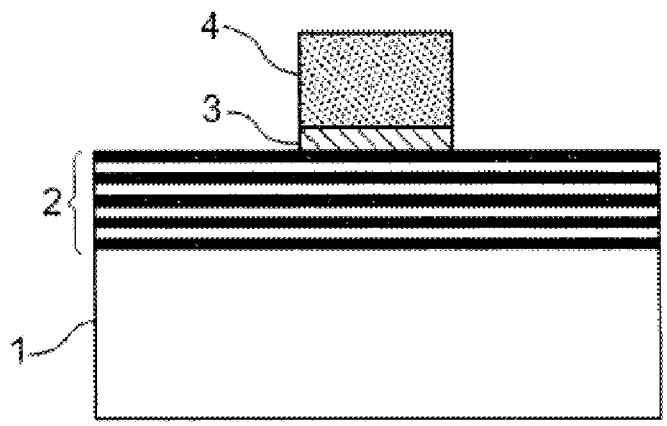
FIGS. 1 and 2 represent a reflection lithography mask of the prior art which has already been described.
Figure 2:
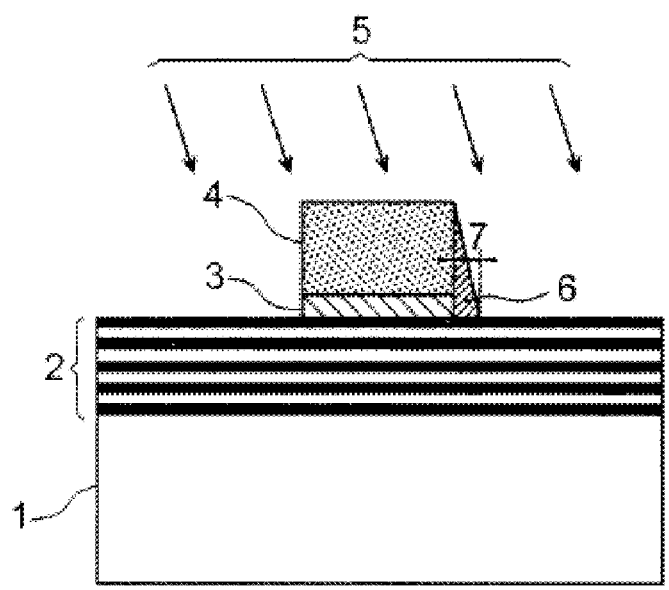
Figure 3B:
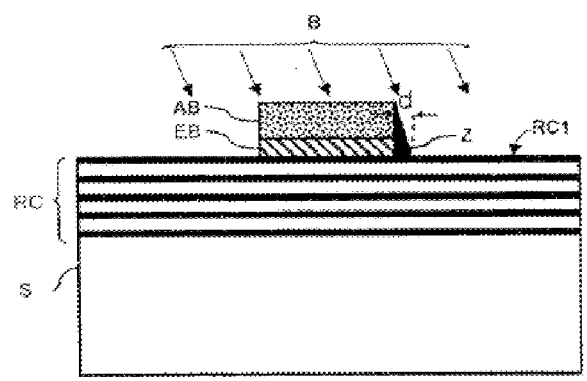

The use of hafnium oxide ($HfO_2$) makes it possible to reduce the thickness of the element because hafnium oxide has a very good absorption coefficient in the EUV range. Thus, during the use of the mask in a reflection lithography process, the mask exposed by a beam B (FIG. 3b) will provide an area of shadow Z which will produce a projected shadow on the surface RC1 of dimension d. Said dimension of said projected shadow will be smaller than the dimension 7 of the shadow made by the absorbing element of FIG. 2.

The use of hafnium oxide ($HfO_2$) in the absorbing layer thus makes it possible to reduce the shadow effects on the surface of the reflector coating of the mask.

The etching barrier layer then can be made of aluminum oxide ($Al_2O_3$). Said layer may also be a stack of several layers, for example layers of chrome and of $Al_2O_3$.

In the specific case of an $HfO_2/Al_2O_3$ stack, a 40-nanometer-thick layer of dielectric $HfO_2$ and a 20-nanometer-thick etching barrier layer of $Al_2O_3$ may be provided. The total thickness of the stack will then be 60 nanometers. These thicknesses are much lower than those of the prior art (typically on the order of 120 nanometers).

Figure 4A:
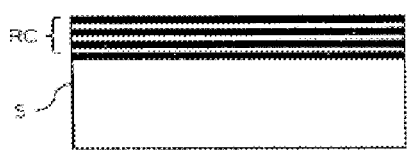
FIGS. 4a to 4h represent various steps of an embodiment of a method for manufacturing a mask according to the invention.

In referring to FIGS. 4a to 4h, an embodiment of a method for manufacturing a mask according to the invention will be described. This method is comprised of the following steps:

Step 1: Deposition by ion beam sputtering (IBS), on a substrate S, of 40 pairs of molybdenum/silicon layers. The alternating layers have a period of 6.95 nm. The reflector coating RC is thus obtained (FIG. 4a).

Step 2: Deposition of a 20-nanometer-thick layer of $Al_2O_3$ by an atomic layer chemical vapor deposition (ALCVD) method at 120° C. The etching barrier layer EB is thus produced (FIG. 4b) The example is one of a plasma etching barrier layer.

Figure 4E:
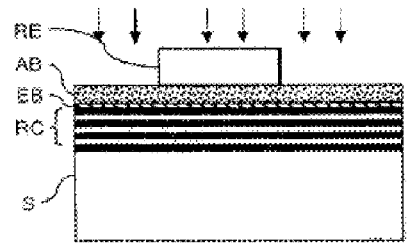
Figure 4B:
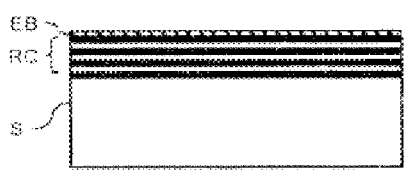
Figure 4F:
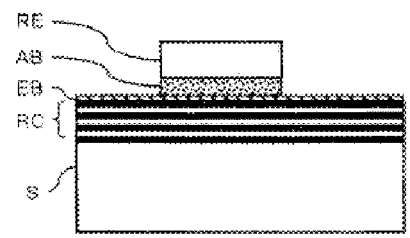
Figure 4C:
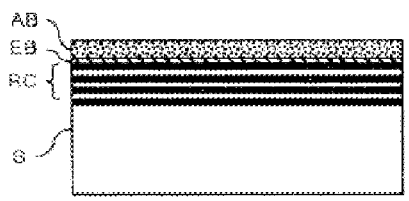
Figure 4G:
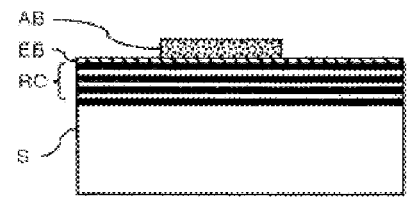

Step 3: Deposition of a 40-nanometer-thick layer of $HfO_2$ by IBS at 50° C. for the purpose of producing the absorbing layer AB (FIG. 4c).

Figure 4D:
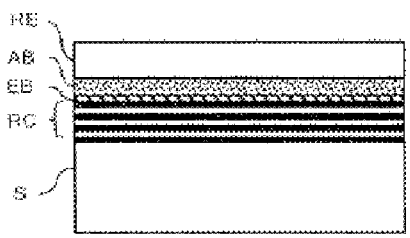

Step 4: Spreading of a lithography resin such as UV5 resin sold by Rohm & Haas Electronics Materials (RHEM) (FIG. 4d).

Step 5: Production in the resin, by UV lithography (at 248 nm) or electron beam lithography, for example, of a pattern having the shape of the absorbing layer to be obtained (FIG. 4e).

Step 6: Etching, for example by plasma, of hafnium oxide ($HfO_2$) at a temperature of approximately 100° C., for example with a mixture of the gases $Cl_2$, HBr and $O_2$. Then, for example, cleaning with 1% HF (hydrofluoric acid) (FIG. 4f).

Of course, other types of etching may be chosen according to the dielectric to be etched.

Step 7: Stripping of the resin (FIG. 4g), for example, in two steps: dry stripping followed by wet stripping (for example by treatment with EKC 265, sold by EKC Technology).

The method used for dry stripping is a method based on argon, oxygen and $CF_4$.

The temperature reached during dry stripping is between 54° C. and 60° C. The temperature was verified using "stickers." Stickers are indicators comprised of various polymers which change color when the temperature on the plate exceeds their glass transition temperature (Tg).

Wet stripping is carried out with the chemical solution EKC 265. The maximum temperature reached during wet stripping is between 65° C. and 70° C. (verification carried out using stickers).

Figure 4H:
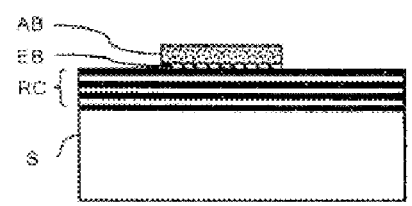

Step 8: Etching of the barrier layer in the etched areas of the layer of $HfO_2$ to locally expose the reflector coating (FIG. 4h).

In the case of an $Al_2O_3$ barrier layer, for example, this step can be a 1% HF chemical etching.

The mask thus produced was the subject of tests and simulations.

It appears that the EUV absorption index (at 13.5 nm) of $HfO_2$ is 0.0465, better than those of materials used such as TaN, which has an absorption index of 0.044, and chrome, which has an index of 0.0383.

By simulation, the reflectivity of the stack of $HfO_2$ and of the layer of $Al_2O_3$ (40 nm of $HfO_2$ and 20 nm of $Al_2O_3$) was found to be less than 0.5% for EUV exposure (at 13.5 nm).

Also by simulation, the reflectivity of this stack was found to be on the order of 1.9% at a wavelength of 248 nm and of 2.9% at a wavelength of 257 nm.

Thus it is seen that the mask according to the invention is satisfactory with a thickness of the absorbing layer clearly lower than existing devices. As an example, the mask described in the document "Cr Absorber Mask for Extreme Ultraviolet Lithography," Guojing Zhang, INTEL Corporation, 3065 Bowers Ave., Santa Clara, Calif. 95052, can be cited. Said mask has an absorbing layer containing chrome and a buffer layer of $SiO_2$ requiring 70 nm of chrome and 90 nm of $SiO_2$, thus giving the absorbing element a thickness of 160 nm.

Returning to the example of the method given above, it is specified that it is preferable to inspect the etching of the absorbing layer before stripping the etching barrier layer. Said inspection is preferably carried out with radiation having a wavelength in the visible to DUV range.

It is also possible to perform a complementary step of repair of the absorbing layer, said step being, for example, localized etching of the absorbing layer or a deposition located on the absorbing layer, in order to very precisely define the final geometry of the mask. This repair step must be made without damaging the reflector coating RC protected by the etching barrier layer EB.

Moreover, it is specified in the invention that the materials and the respective thicknesses of the absorbing layer and the barrier layer are selected in such a way that the stack of these layers forms an interference system exhibiting good absorption in the EUV range and, once the absorbing layer is etched, good reflectivity contrast in the DUV-visible range between the etched and unetched regions. (in order to carry out the inspection step mentioned above).

These layers must also exhibit good etch selectivity so that the absorbing layer can be etched without damaging the reflective multilayer. Similarly, the barrier layer must have good etch selectivity with respect to the reflective multilayer so that it can be eliminated without damaging said multilayer.

The $HfO_2/Al_2O_3$ combination is particularly advantageous as it meets these various criteria.

The fact of using two dielectric materials for the absorbing layer and for the barrier layer is advantageous. Indeed, these materials are transparent for the wavelengths used for inspection (DUV-visible range), which makes it possible to optimize the criteria previously defined with minimal thicknesses for these layers.

The simulation results given above are for a stack of 40 nm of $HfO_2$ and 20 nm of $Al_2O_3$, which is 60 nm in total. Said stack of very low thickness demonstrated very good optical qualities, thus limiting shadow effects, among other things.

The invention claimed is:

1. A reflection lithography mask comprising, on a substrate, a reflector coating and a stack comprised of an etching barrier layer and an absorbing layer, said stack covering only a part of the reflector coating, wherein the absorbing layer is made solely of dielectric material and constitutes the surface layer of the mask, and wherein the dielectric material contains hafnium (Hf),
wherein the dielectric material of the absorbing layer is made of hafnium oxide ($HfO_2$) and the etching barrier layer is made of aluminum oxide ($Al_2O_3$).

2. A mask according to claim 1, wherein the aforementioned dielectric material is absorbent in the extreme ultraviolet (EUV) radiation wavelength range.

3. A mask according to claim 1, wherein the dielectric material is hafnium oxide ($HfO_2$).

4. A mask according to claim 1, wherein the respective thicknesses of the absorbing layer and the etching barrier layer are selected in such a way that the stack of said layers forms an interference system exhibiting good absorption in the EUV range and good reflectivity contrast in the DUV-visible range during a step of inspection of the etching of the absorbing layer.

5. A mask according to claim 1, wherein the materials of the absorbing layer and the etching barrier layer are selected in such a way that they have good etch selectivity and that the etching barrier layer has good etch selectivity with respect to the reflector coating.

6. A mask according to claim 1, wherein the etching barrier layer is made of a dielectric material.

7. A mask according to claim 1, wherein the thicknesses of $HfO_2$ and $Al_2O_3$ are equal to 40 nm and 20 nm, respectively.

8. A method for manufacturing a reflection mask that includes, on a substrate, a reflector coating and a stack comprised of an etching barrier layer and an absorbing layer, said stack covering only a part of the reflector coating, wherein the absorbing layer is made solely of dielectric material and constitutes the surface layer of the mask, and wherein the dielectric material contains hafnium (Hf), the method comprising the following steps:
   a. Step 1: deposition, on a substrate (S), of alternating reflecting layers of different optical indices, forming an interference system,
   b. Step 2: deposition of an etching barrier layer on the aforementioned alternating layers,
   c. Step 3: deposition of a layer of a dielectric material for the purpose of producing the absorbing layer,
   d. Step 4: spreading of a lithography resin,
   e. Step 5: production, in the resin, of a pattern having the shape of the absorbing layer to be obtained,
   f. Step 6: etching of the layer of dielectric material,
   g. Step 7: stripping of the resin
   h. Step 8: etching of the etching barrier layer,
      wherein complementary etching of the absorbing layer is performed in order to allow good etching of the absorbing layer without damaging the reflective multilayer comprised of the alternating reflecting layers, said reflective multilayer being protected by the etching barrier layer.

9. A method for manufacturing a mask according to claim 8, wherein the dielectric material is $HfO_2$.

10. A manufacturing method according to claim 9, wherein step 3 is carried out by ion beam sputtering at a temperature of approximately 50° C.

11. A method according to claim 8, comprising in addition a step of inspection of the etching of the absorbing layer before the stripping of the etching barrier layer.

12. A method according to claim 11, wherein the inspection is carried out by means of radiation having a wavelength in the visible to deep ultraviolet (DUV) range.

13. A method according to claim 8, wherein the complementary etching is localized.

* * * * *